United States Patent
Tsao et al.

(10) Patent No.: US 9,307,660 B2
(45) Date of Patent: Apr. 5, 2016

(54) ELECTRONIC EQUIPMENT

(71) Applicant: Acer Incorporated, New Taipei (TW)

(72) Inventors: Jung-Wei Tsao, New Taipei (TW); Wei-Min Huang, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 280 days.

(21) Appl. No.: 13/953,488

(22) Filed: Jul. 29, 2013

(65) Prior Publication Data

US 2014/0036425 A1 Feb. 6, 2014

(30) Foreign Application Priority Data

Jul. 31, 2012 (TW) ............................... 101127563 A
Jul. 4, 2013 (TW) ............................... 102123931 A

(51) Int. Cl.
*H05K 5/02* (2006.01)
*G06F 1/16* (2006.01)

(52) U.S. Cl.
CPC ............ *H05K 5/0226* (2013.01); *G06F 1/1618* (2013.01); *G06F 1/1681* (2013.01)

(58) Field of Classification Search
CPC ..... G06F 1/1681; G06F 1/162; G06F 1/1618; H05K 5/0086; H05K 5/0226; H05K 5/023; H05K 5/03; H05K 7/1449
USPC ............. 361/679.01, 679.02, 679.21, 679.26, 361/679.27; 455/575.1–575.4; 379/433.11–433.13; 248/917–924
See application file for complete search history.

(56) References Cited

U.S. PATENT DOCUMENTS

| | | | |
|---|---|---|---|
| 6,005,767 A | 12/1999 | Ku et al. | |
| 6,266,241 B1 | 7/2001 | Van Brocklin et al. | |
| 7,200,224 B2 | 4/2007 | Park et al. | |
| 2007/0091553 A1 | 4/2007 | Chang | |
| 2008/0054149 A1* | 3/2008 | Freebairn | 248/346.02 |
| 2012/0099249 A1* | 4/2012 | Duan et al. | 361/679.01 |
| 2012/0162864 A1* | 6/2012 | Wikander et al. | 361/679.01 |

FOREIGN PATENT DOCUMENTS

| | | |
|---|---|---|
| CN | 2386480 Y | 7/2000 |
| CN | 1499735 A | 5/2004 |
| CN | 2754312 Y | 1/2006 |
| CN | 1750745 A | 3/2006 |
| CN | 201078392 Y | 6/2008 |

(Continued)

OTHER PUBLICATIONS

TW Office Action dated May 27, 2015 in corresponding Taiwan application (No. 102123931).

(Continued)

*Primary Examiner* — Anthony Haughton
*Assistant Examiner* — Ingrid Wright
(74) *Attorney, Agent, or Firm* — McClure, Qualey & Rodack, LLP

(57) ABSTRACT

A collapsible electronic equipment is provided, including a first part, a first rotary mechanism, a joint element, and a second part. The first part has a first side and a second side. The first rotary mechanism is disposed on the first part, and the joint element is disposed on the first rotary mechanism. The second part is pivotally connected to the joint element. When the second part is situated on a first side/a second side of the first part, the joint element or the second part contacts the first side/the second side of the first part.

9 Claims, 12 Drawing Sheets

(56) References Cited

FOREIGN PATENT DOCUMENTS

| CN | 101608659 A | 12/2009 |
|---|---|---|
| CN | 201696460 U | 1/2011 |
| EP | 1614913 A1 | 1/2006 |
| TW | M363189 U1 | 8/2009 |

OTHER PUBLICATIONS

CN Office Action dated Apr. 3, 2015 in corresponding Chinese application (No. 201310322692.7).

* cited by examiner

ELECTRONIC EQUIPMENT

CROSS REFERENCE TO RELATED APPLICATIONS

The present application is based on, and claims priority from, Taiwan Patent Application No. 101127563, filed on Jul. 31, 2012, and Taiwan Patent Application No. 102123931, filed on Jul. 4, 2013, the disclosure of which is hereby incorporated by reference herein in its entirety.

BACKGROUND OF THE INVENTION

1. Field of the Invention

The application relates in general to electronic equipment, and in particular, to collapsible electronic equipment.

2. Description of the Related Art

Touch screens have become common in recent years. Thus, in the prior arts, there are numerous notebook computers with touch screens. Commonly, the front of a notebook computer touch screen can be rotated to the rear side of the notebook computer via dual-hinges. However, a dual-hinged notebook computer usually has a complex structure and is costly. Moreover, rotation of the dual-hinges is often not smooth.

BRIEF SUMMARY OF INVENTION

An embodiment of the invention provides a collapsible electronic equipment, comprising a first part, a first rotary mechanism, a joint element, and a second part. The first part includes a first side and a second side opposite to the first side. The first rotary mechanism is disposed on the first part and the joint element is disposed on the first rotary mechanism. The second part is pivotally connected to the joint element. When the second part is located at a first side of the first part, the joint element or the second part contacts with the first side. When the second part is located at a second side of the first part, the joint element or the second part contacts with the second side of the first part.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
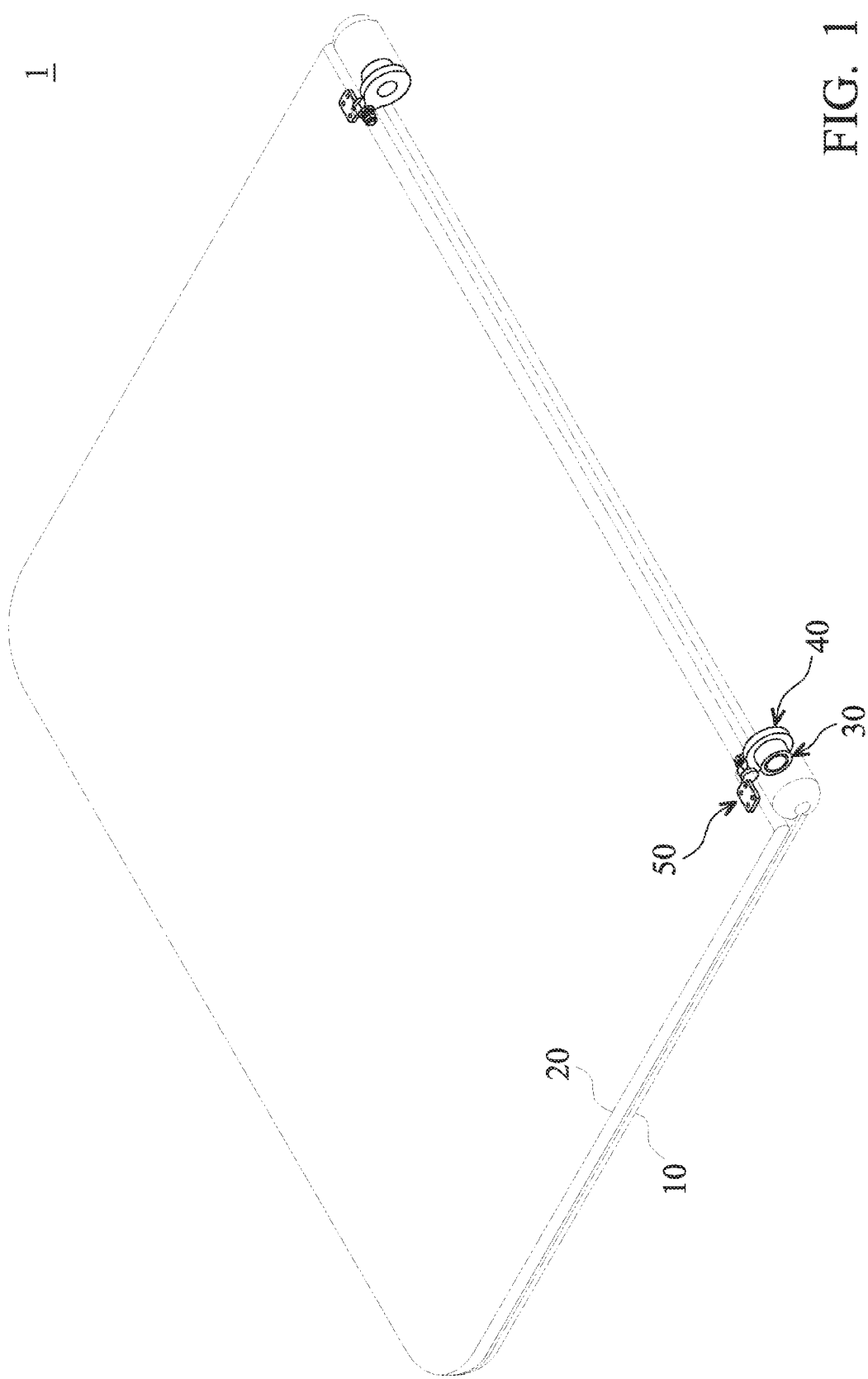
FIG. 1 is a perspective diagram of a collapsible electronic equipment according to an embodiment of the invention.
Figure 2:
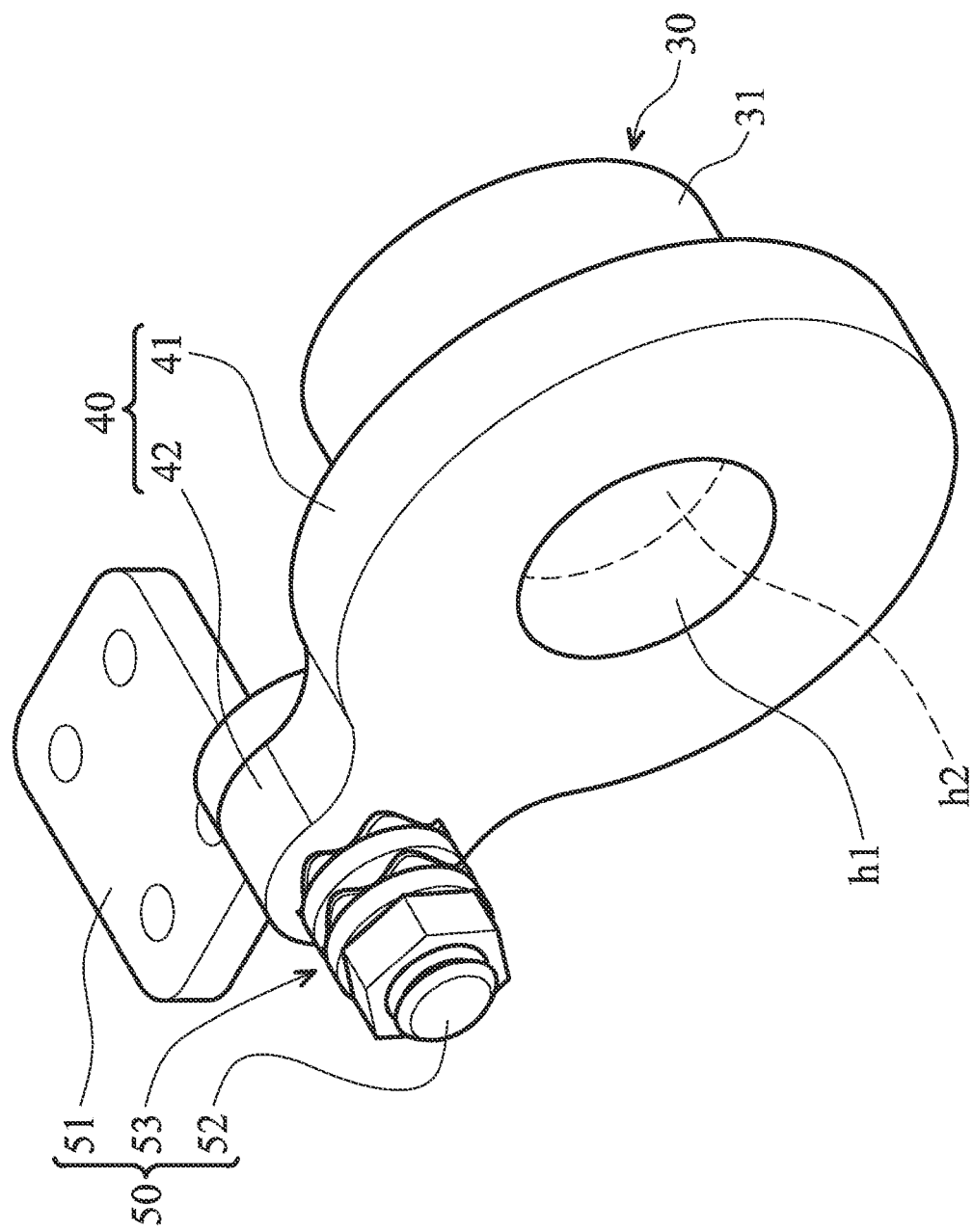
FIG. 2 is a perspective diagram of a first rotary mechanism, a joint element, and a second rotary mechanism according to an embodiment of the invention.
Figure 3:
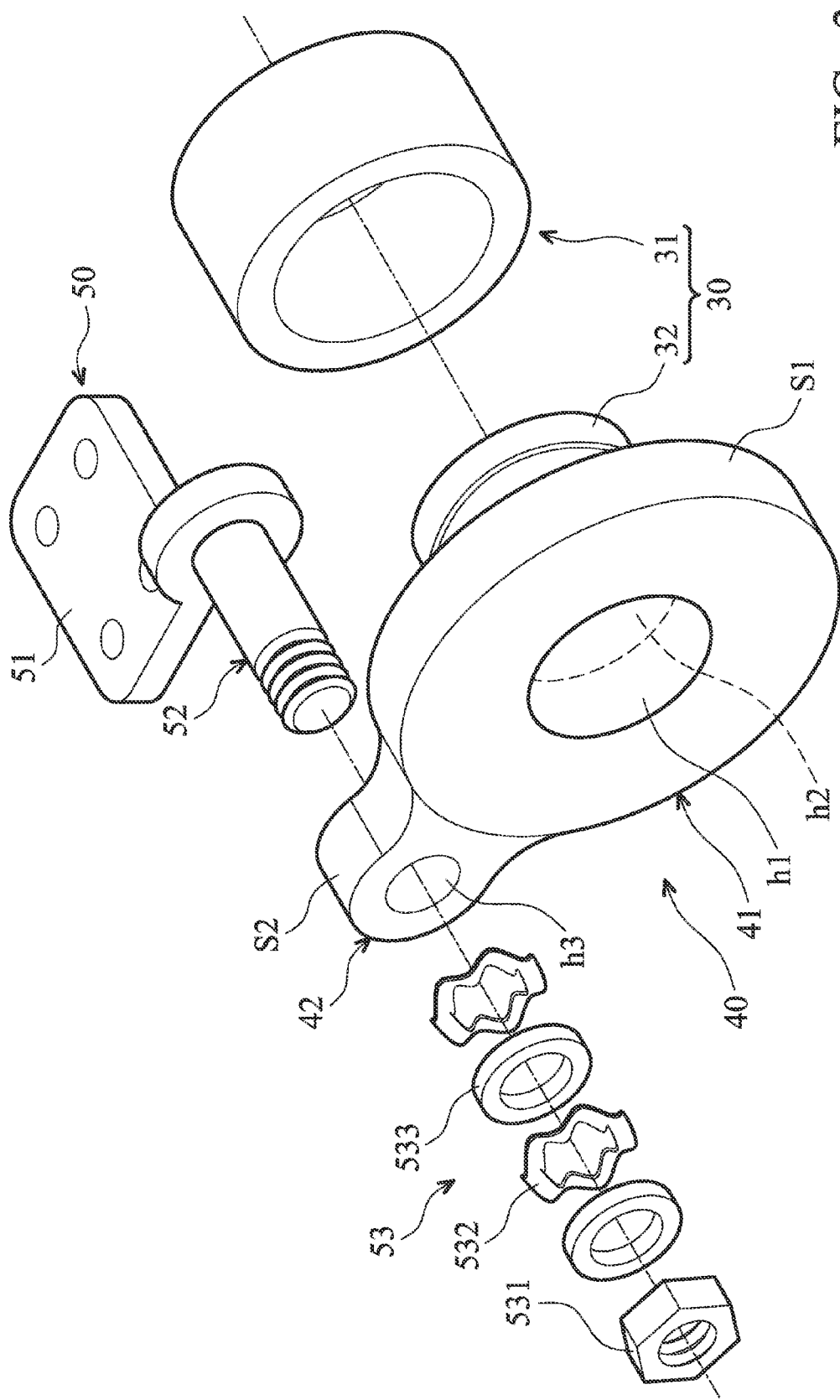
FIG. 3 is an exploded diagram of a first rotary mechanism, a joint element, and a second rotary mechanism according to an embodiment of the invention.

FIG. 1 is a perspective diagram of a collapsible electronic equipment 1 according to an embodiment of the invention. The collapsible electronic equipment 1 can be a notebook computer, comprising a first part 10, a second part 20, a first rotary mechanism 30, a joint element 40, and a second rotary mechanism 50.

The first part 10 is a main body of the electronic equipment 1, which may include a keyboard, a touchpad, a touch panel, a CPU, a RAM, and a mainboard. The second part 20 may comprise a display, such as a touch screen. The first rotary mechanism 30 is disposed between the first part 10 and the joint element 40. The second part 20 can rotate relative to the first part 10 by the first rotary mechanism 30, the joint element 40, and the second rotary mechanism 50.

FIGS. 2-5 are a perspective diagram, an exploded diagram, and two different cross-section diagrams of the first rotary mechanism 30, the joint element 40, and the second rotary mechanism 50 according to an embodiment of the invention, respectively. The first rotary mechanism 30 includes a first fixing element 31 and a first shaft 32, wherein the first fixing element 31 is fixed to the first part 10. Furthermore, the first fixing element 31 may have an annular structure which is pivotally connected to the first shaft 32. Thus, a resistant torque can be generated between the first fixing element 31 and the first shaft 32.

The first shaft 32 is extended along a first axis AX1 (FIG. 4) and rotatable with respect to the first axis AX1. In this embodiment, the first shaft 32 is fixed to the joint element 40.

The joint element 40 has a plate-shaped structure, comprising a first connecting portion 41 and a second connecting portion 42. The first and second connecting portions 41 and 42 respectively have an annular structure and can be integrally formed in one piece. The second connecting portion 42 includes a hole h3.

The first shaft 32 is fixed to the first connecting portion 41. The first connecting portion 41 includes a first through hole h1, and the first shaft 32 includes a second through hole h2 communicating with the first through hole h1. The first axis AX1 is extended through the center of the first and second through holes h1 and h2. The first and second through holes h1 and h2 can reduce the cost of materials and facilitate the aesthetic appearance of the collapsible electronic equipment 1.

The second rotary mechanism 50 includes a second fixing element 51, a second shaft 52, and a torque module 53. The second fixing element 51 is fixed to the second part 20.

The second shaft 52 is fixed to the second fixing element 51 and extends through a second axis AX2, wherein the second shaft 52 is rotatable relative thereto. Furthermore, by extension through the hole h3, the second shaft 52 is pivotally connected to the second connecting portion 42.

The second shaft 52 is extended through the hole h3. The first axis AX1 is parallel to the second axis AX2, and the joint element 40 is perpendicular to the first and second axes AX1 and AX2.

The torque module 53 is disposed on the second shaft 52 and contacts the second connecting portion 42. A torque is produced between the second shaft 52 and the second connecting portion 42 by the torque module 53. In this embodiment, the torque module 53 comprises a screw nut 531, a plurality of annular elastic pieces 532, and a plurality of annular washers 533. The screw nut 531 is disposed at an end of the second shaft 52. The annular elastic pieces 532 and the annular washers 533 are disposed on the second shaft 52 in an interlaced manner between the screw nut 531 and the second connecting portion 42.

Figure 4:
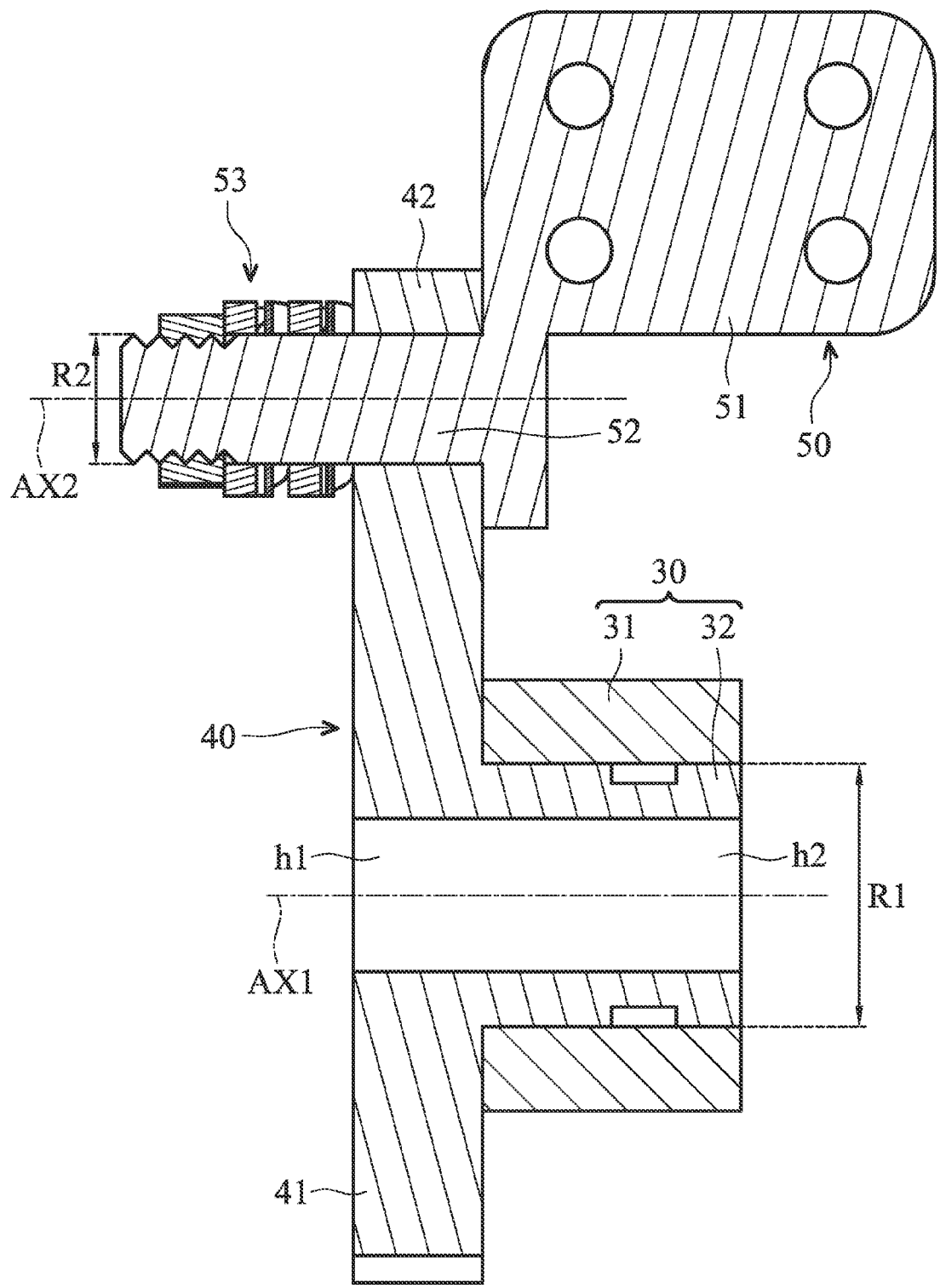
FIG. 4 is a cross-section view of a first rotary mechanism, a joint element, and a second rotary mechanism according to an embodiment of the invention.
Figure 5:
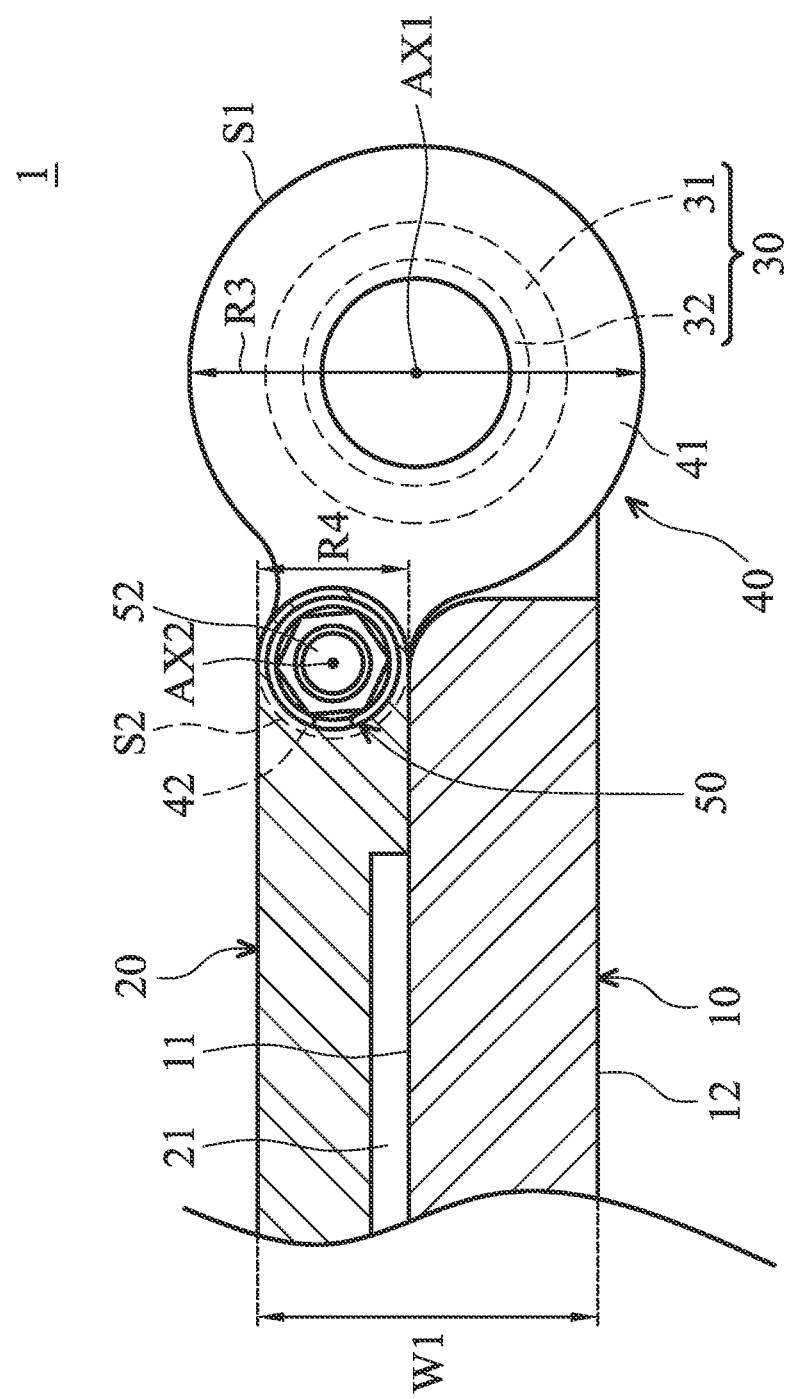
FIG. 5 is another cross-section view of a first rotary mechanism, a joint element, and a second rotary mechanism according to an embodiment of the invention.

As shown in FIG. 4 and FIG. 5, a diameter R1 of the first shaft 32 is larger than a diameter R2 of the second shaft 52. In this embodiment, the diameter R1 may exceed 1.5 or 2 times of the diameter R2. A diameter R3 of the first connecting portion 41 is larger than a total thickness W1 of the first and second parts 10 and 20. R3 is also larger than a diameter R4 of the second connecting portion 42. In some embodiments, the diameter R3 is larger than 2 or 3 times of the diameter R4. The diameters R1, R2, R3, and R4 are perpendicular to the first axis AX1 or the second axis AX2.

Furthermore, the first connecting portion 41 includes a first curved surface S1, and the first axis AX1 is at the center of the first curved surface S1. The second connecting portion 42 includes a second curved surface S2, and the second axis AX2 is at the center of the second curved surface S2. The curvature ratio of the second curved surface S2 is larger than that of the first curved surface S1. In some embodiments, the curvature ratio of the second curved surface S2 is larger than 1.5 or 2 times of the first curved surface S1. Thus, the second part 20 can rotate to the front side or the rear side of the first part 10.

Figure 6:
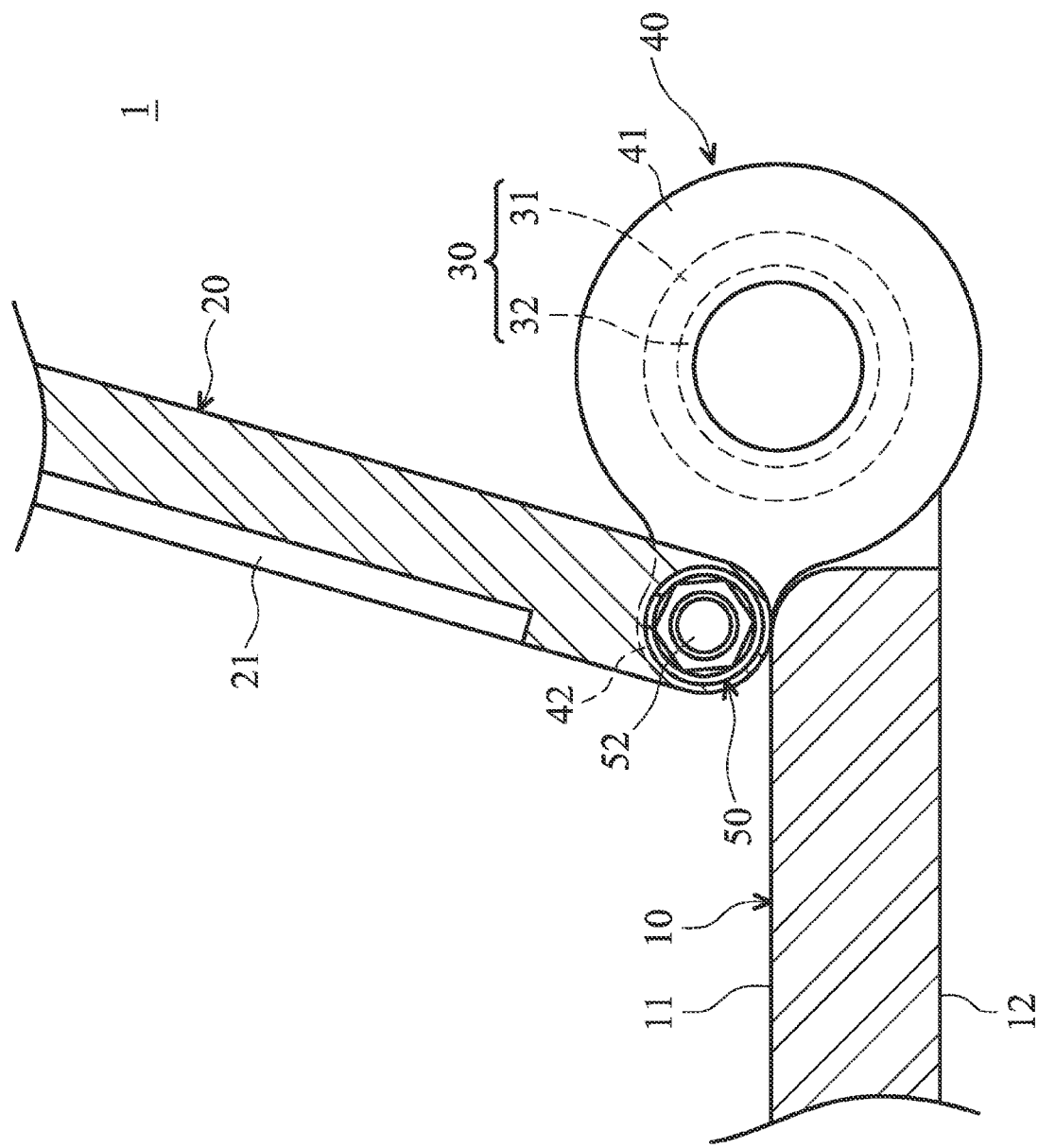
FIGS. 6-9 are schematic diagrams of a collapsible electronic equipment according to an embodiment of the invention.
Figure 7:
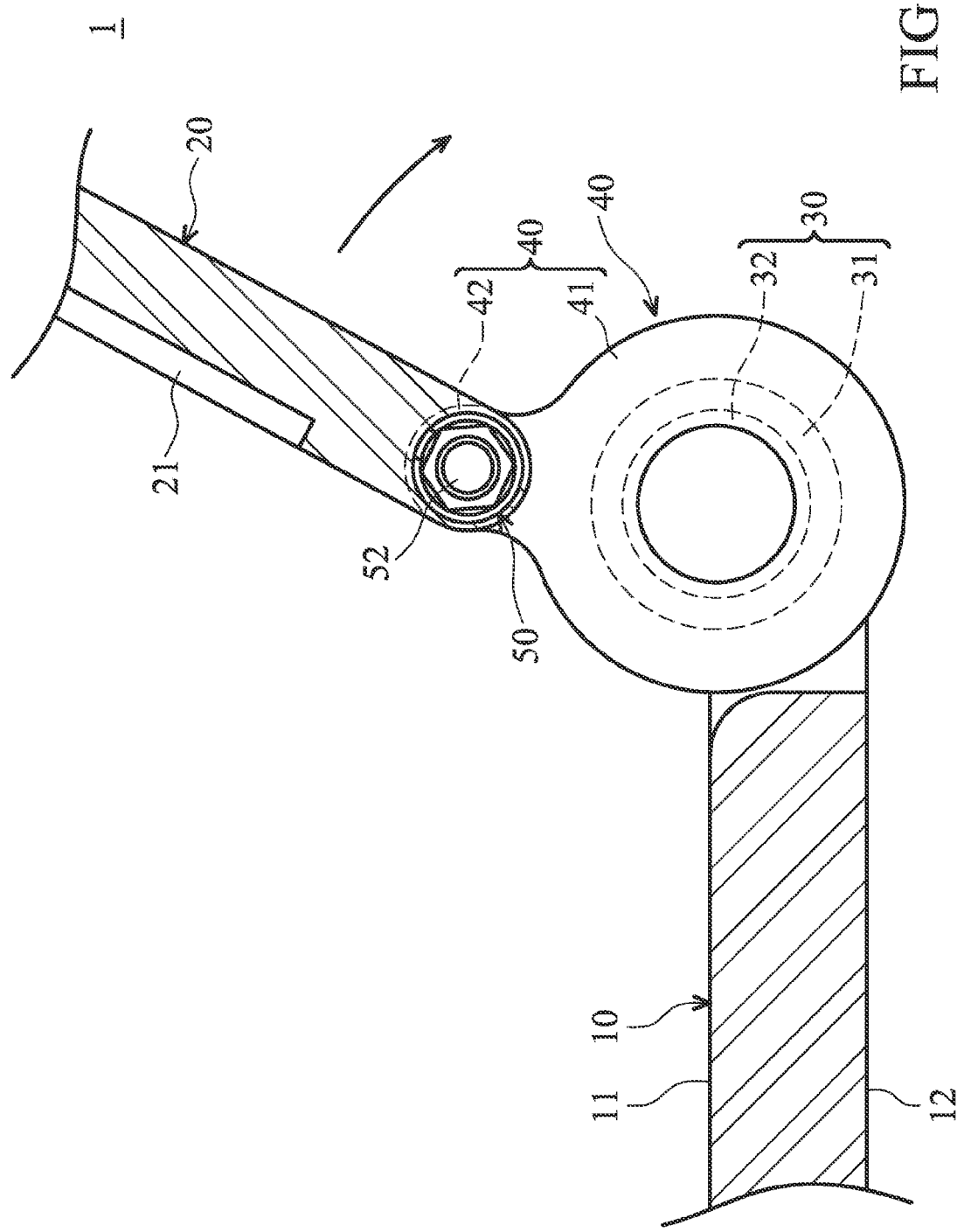
Figure 8:
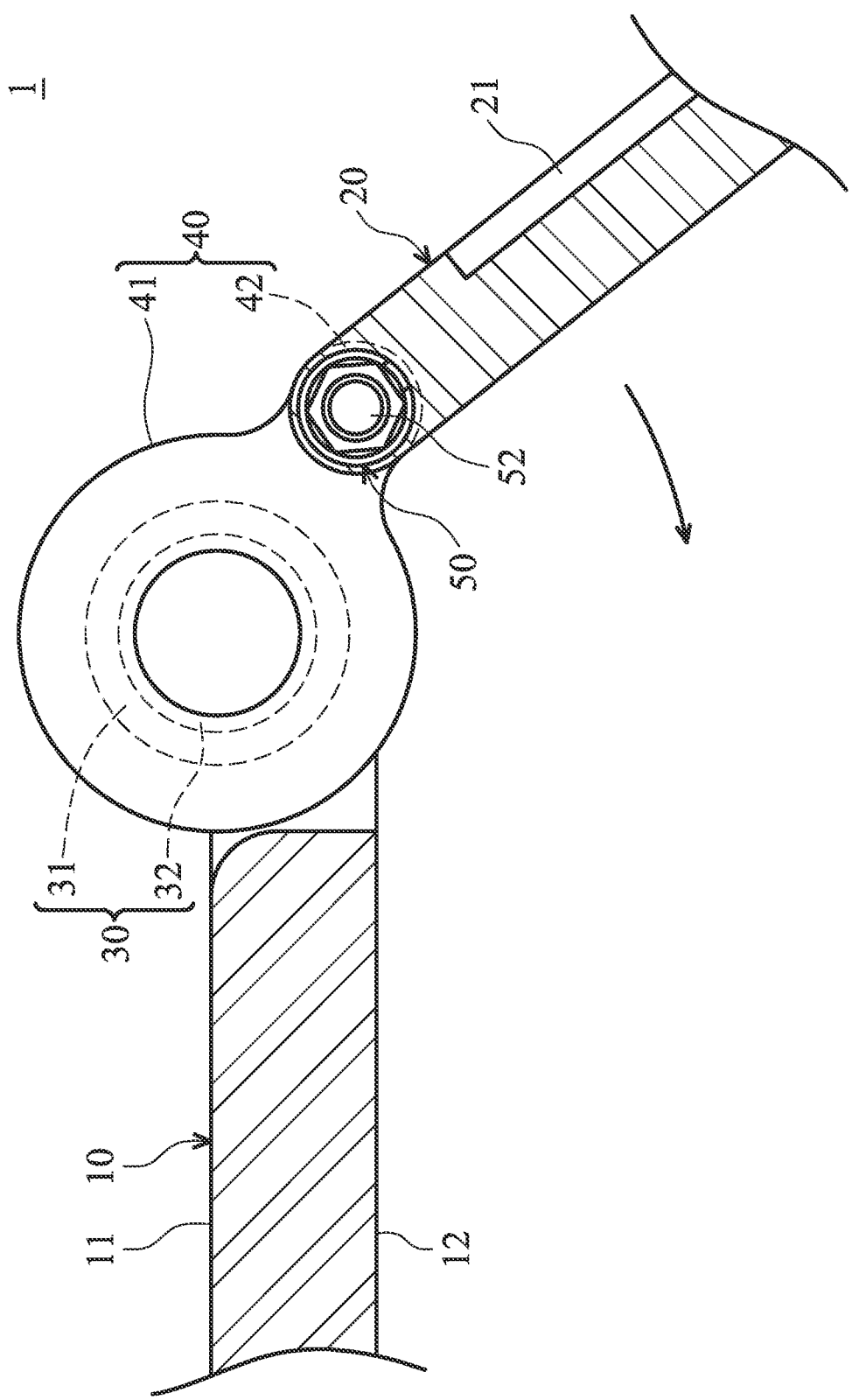

As shown in FIG. 5, the first part 10 includes a first side 11 and a second side 12 opposite to the first side 11. When the second part 20 is folded relative to the first part 10, the second shaft 52 is situated above the first part 10, and the second connecting portion 42 of the joint element 40 abuts the first side 11 of the first part 10. In this embodiment, the resistant torque between the first part 10 and the first connecting portion 41 of the joint element 40 is larger than the resistant torque between the second part 20 and the second connecting portion 42 of the joint element 40. Thus, as shown in FIG. 6, the second part 20 can rotate relative to the first part 10 without rotation between the joint element 40 and the first part 10. Therefore, the second part 20 can rotate more smoothly.

As shown in FIG. 6, the second part 20 is inclined relative to the first part 10, and situated on the first side 11. In the collapsible electronic equipment 1, as the second connecting portion 42 and/or the end of the second part 20 abuts/abut the first side 11, the second part 20 can remain inclined relative to the first part 10 and does not need much frictional torque between the joint element 40 and the first part 10 for supporting the second part 20. Thus, the required torque between the first connecting portion 41 and the first part 10 can be reduced, and the second part 20 can rotate to the second side 12 of the first part 10 easier. In addition, as the first part 10 is between a touch screen 21 of the second part 20 and a user (FIG. 6), the collapsible electronic equipment 1 can be used as a notebook computer.

As shown in FIGS. 6-9, the second part 20 rotates from the first side 11 of the first part 10 to the second side 12. Meanwhile, the joint element 40 rotates relative to the first part 10, and the second part 20 rotates relative to the joint element 40.

Figure 9:
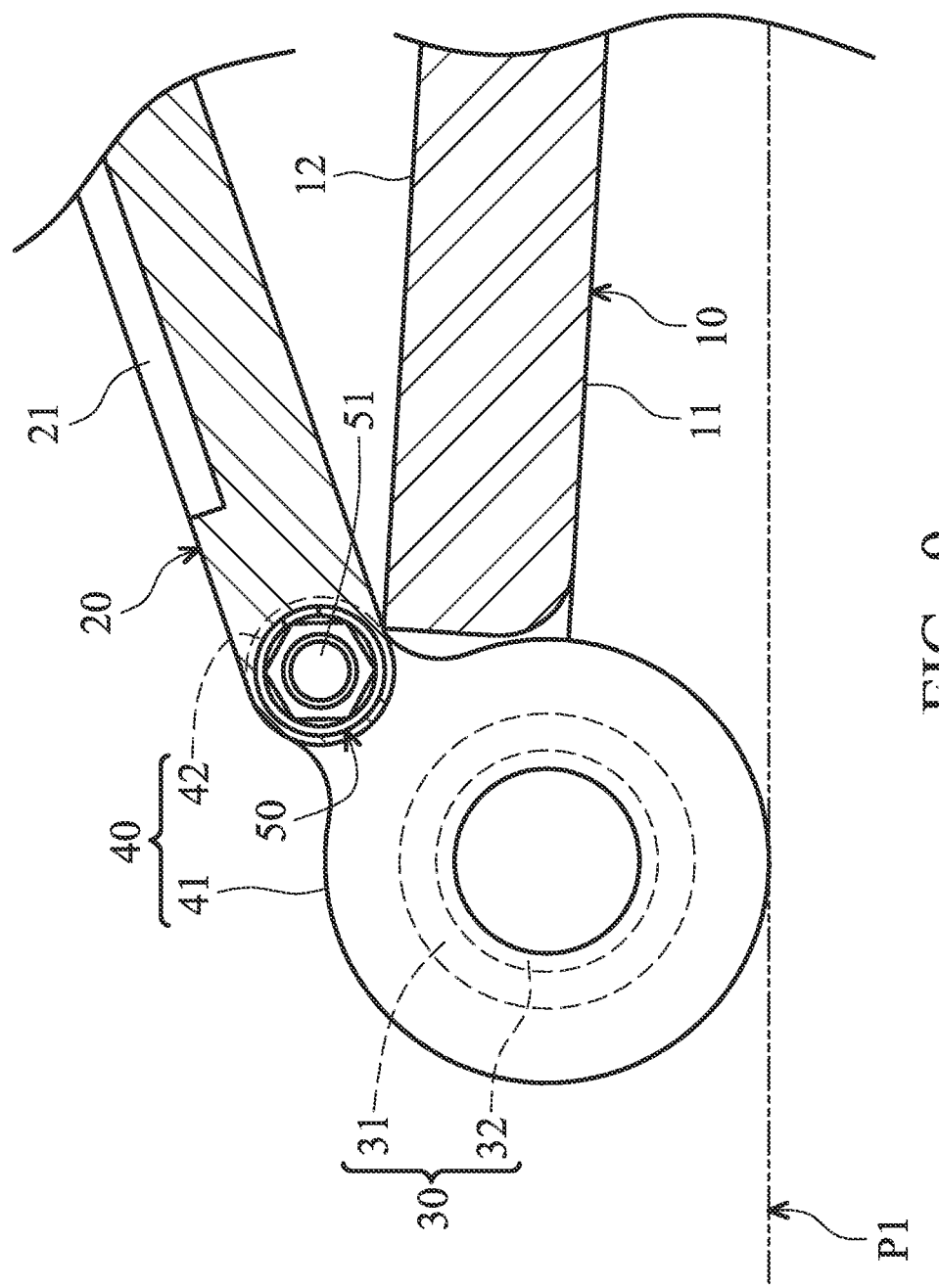

As shown in FIG. 9, when the second part 20 is inclined relative to the first part 10 and situated on the second side 12, the first part 10 can be placed on a plane P1. Here, the first part 10 is inclined relative to the plane P1, and the first connecting portion 41 contacts the plane P1. In this state, the second connecting portion 42 or an end of the second part 20 may abut the second side 12 of the first part 10. Similarly, the second part 20 can remain inclined relative to the first part 10 and does not need much resistant torque between the joint element 40 and the first part 10. Thus, the torque between the joint element 40 and the first part 10 can be reduced. The second part 20 can rotate to the first side 11 of the first part 10 easier. As shown in FIG. 9, when the second part 20 is situated on the second side 12, the touch screen 21 of the second part 20 is closer to the user than the first part 10. Therefore, it is easier for the user to use the touch screen 21.

The collapsible electronic equipment 1 in this embodiment has a simple rotary structure, so the manufacturing cost is not high. Moreover, when the second part is inclined relative to the first part, the second connecting portion or the second part abuts the first part, so that the torque between the first part and the first connecting portion is larger than the torque between the second part and the second connecting portion. Thus, the second part can rotate more smoothly.

Figure 10A:
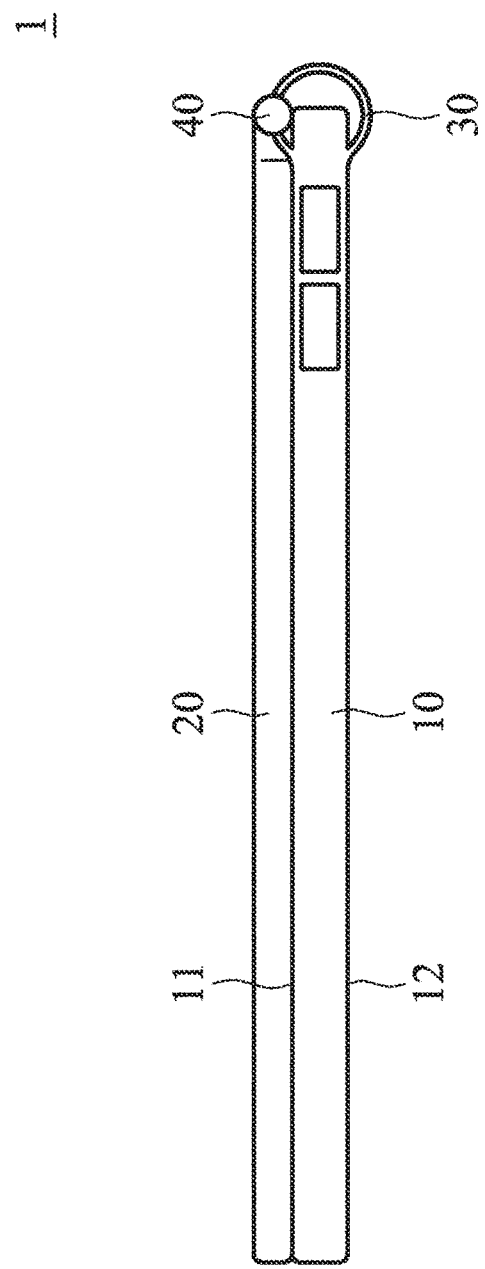
FIGS. 10A-10C are schematic diagrams of a collapsible electronic equipment according to another embodiment of the invention.
Figure 10B:
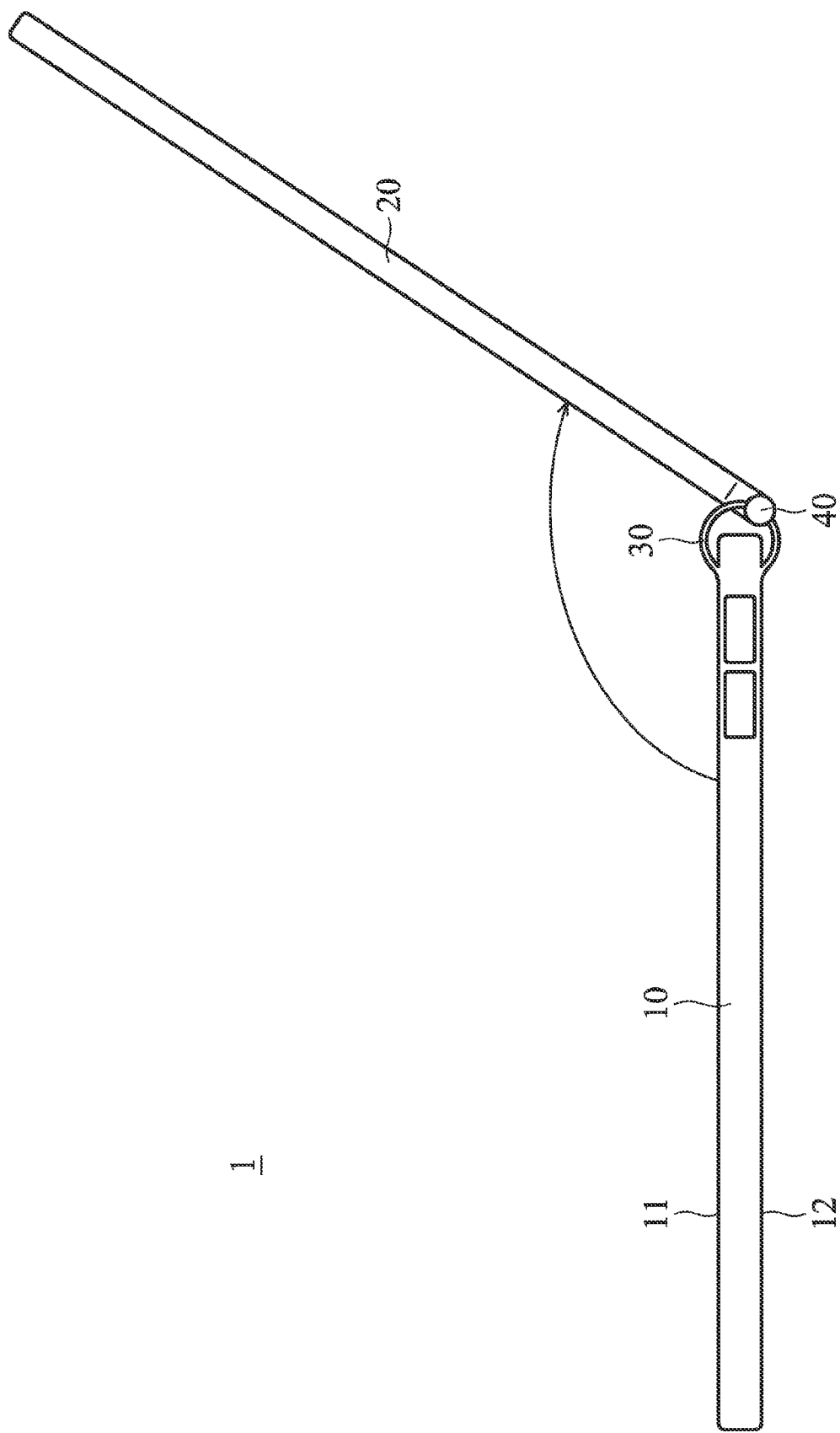
Figure 10C:
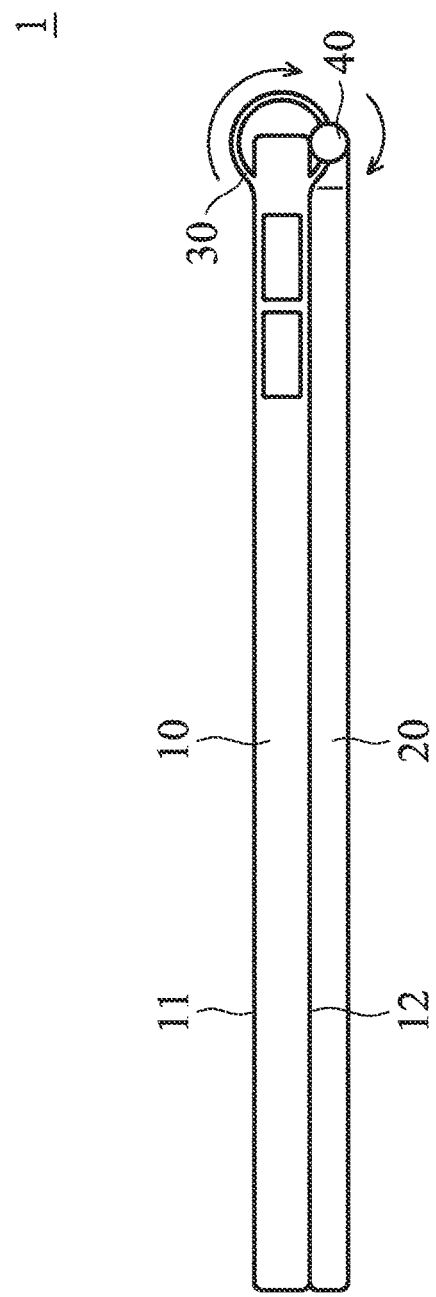

FIGS. 10A-10C show another embodiment of a collapsible electronic equipment 1. In this embodiment, a first rotary mechanism 30 forms a C-shaped rail at the end of the first part 10. The joint element 40 has a cavity (not shown) with the C-shaped rail extended therethrough. Thus, the joint element 40 can slide along the C-shaped rail. The joint element 40 is pivotally connected to the second part 20. As shown in FIG. 10A, when the second part 20 is closed relative to the first part 10, the second part 20 is situated on the first side 11 of the first part 10, and the second part 20 is substantially parallel to the first part 10. Meanwhile, the joint element 40 is situated on a first position of the C-shaped rail, The joint element 40 and the second part 20 abut the first side 11 of the first part 10. As shown in FIG. 10B, when the joint element 40 slides from the first position to a transition position of the C-shaped rail, an inclined angle is formed between the second part 20 and the first part 10. Thus, it is easier for a user to watch the screen. After that, as shown in FIG. 10C, when the joint element 40 slides from the transition position to a second position, the second part 20 can rotate to the second side 12 of the first part 10, such that the second part 20 is substantially parallel to the first part 10. When the joint element 40 is situated in the second position (FIG. 10C), the joint element 40 and the second part 20 can abut the second side 12 of the first part 10. Thus, whether the second part 20 is situated on the first side 11 or the second side 12, the first part 10 can be used to support the second part 20, such that the required torque can be reduced. It should be realized that the second part 20 can rotate relative to the joint element 40 when the joint element 40 is in any position of the C-shaped rail.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A collapsible electronic equipment, comprising:
   a first part, having a first side and a second side opposite to the first side;
   a second part;
   a first rotary mechanism, disposed on the first part and having a first shaft;
   a second rotary mechanism, having a second shaft; and
   a joint element, disposed on the first rotary mechanism, pivotally connected to the second part, and having a first connecting portion and a second connecting portion, wherein the first shaft is disposed on the first connecting portion and pivotally connected to the first part and the joint element, the second shaft is disposed on the second connecting portion and pivotally connected to the second part and the joint element, and a diameter of the first connecting portion is larger than the total thickness of the first part and the second part;
   wherein when the second part is inclined relative to the first part and situated on the first side, the joint element or the second part abuts the first side, and
   wherein when the second part is inclined relative to the first part and located at the second side, the joint element or the second part abuts the second side.

2. The collapsible electronic equipment as claimed in claim 1, wherein the resistant torque between the first part and the first connecting portion is larger than the resistant torque between the second part and the second connecting portion.

3. The collapsible electronic equipment as claimed in claim 1, wherein the first rotary mechanism comprises a first fixing element fixed to the first part, and the first shaft is fixed to the first connecting portion and pivotally connected to the first fixing element.

4. The collapsible electronic equipment as claimed in claim 1, wherein the first connecting portion has a first through hole, the first shaft has a second through hole and a first axis, and the second connecting portion has a shaft hole, wherein the first through hole is communicated with the second through hole, the first axis is extended through a center of the first through hole and the second through hole, and the second shaft is extended through a center of the shaft hole.

5. The collapsible electronic equipment as claimed in claim 3, wherein the diameter of the first connecting portion is perpendicular to the first axis.

6. The collapsible electronic equipment as claimed in claim 3, wherein the second shaft has a second axis, and the first connecting portion has a first curved surface, and the first axis extends through the center of the first curved surface, wherein the second connecting portion has a second curved surface, the second axis extends through the center of the second curved surface, and the curvature ratio of the second curved surface is larger than that of the first curved surface.

7. The collapsible electronic equipment as claimed in claim 1, wherein the second rotary mechanism comprises a second fixing element fixed to the second part, and the second shaft is fixed to the second fixing element and pivotally connected to the second connecting portion.

8. The collapsible electronic equipment as claimed in claim 1, wherein the second rotary mechanism comprises a torque module disposed on the second shaft and abutting the second connecting portion, wherein the torque module produces a torque between the second shaft and the second connecting portion.

9. The collapsible electronic equipment as claimed in claim 1, wherein the first rotary mechanism forms a C-shaped rail, and the joint element has a cavity, wherein the C-shaped rail is extended through the cavity, and the joint element is slidable along the C-shaped rail.

\* \* \* \* \*